(12) United States Patent
Hirata et al.

(10) Patent No.: US 11,908,712 B2
(45) Date of Patent: Feb. 20, 2024

(54) SEMICONDUCTOR MANUFACTURING APPARATUS, SUBSTRATE TRANSFER METHOD, AND PROGRAM

(71) Applicant: TOKYO ELECTRON LIMITED, Tokyo (JP)

(72) Inventors: Toshiharu Hirata, Yamanashi (JP); Takafumi Matsuhashi, Yamanashi (JP); Kunio Takano, Yamanashi (JP); Minoru Nagasawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 17/481,973

(22) Filed: Sep. 22, 2021

(65) Prior Publication Data

US 2022/0093425 A1 Mar. 24, 2022

(30) Foreign Application Priority Data

Sep. 23, 2020 (JP) .................................. 2020-158377

(51) Int. Cl.
*H01L 21/67* (2006.01)

(52) U.S. Cl.
CPC .. *H01L 21/67173* (2013.01); *H01L 21/67276* (2013.01)

(58) Field of Classification Search
CPC ........ G05B 19/042; G05B 2219/45031; H01L 21/00; H01L 21/02; H01L 23/00; H01L 21/67173; H01L 21/67196; H01L 21/67745; Y02P 90/02; Y02P 20/00
See application file for complete search history.

(56) References Cited

U.S. PATENT DOCUMENTS

| | | | | |
|---|---|---|---|---|
| 6,983,195 B2* | 1/2006 | Iijima | ............... | H01L 21/67276 700/218 |
| 2003/0154001 A1* | 8/2003 | Oh | ................... | G05B 19/41865 700/217 |
| 2005/0191051 A1* | 9/2005 | Miyata | .............. | H01L 21/67276 396/611 |
| 2006/0161286 A1* | 7/2006 | Kobayashi | ............. | G06Q 10/04 700/100 |
| 2014/0093984 A1* | 4/2014 | Itou | ................... | H01L 21/67155 15/21.1 |
| 2016/0064261 A1* | 3/2016 | Li | .................... | G05B 19/41865 700/100 |

FOREIGN PATENT DOCUMENTS

JP 2020-009837 A 1/2020

* cited by examiner

*Primary Examiner* — Kidest Bahta
(74) *Attorney, Agent, or Firm* — Fenwick & West LLP

(57) ABSTRACT

A semiconductor manufacturing apparatus including a plurality of process modules for performing desired processes on a plurality of substrates and a plurality of transfer modules for serially transferring the plurality of substrates to the plurality of process modules is provided. The semiconductor manufacturing apparatus comprises a scheduler for calculating a cycle time so that a difference in time required for each of the desired processes is within an allowable time range and generating a transfer plan for the plurality of substrates based on the cycle time, and a transfer controller for controlling the plurality of transfer modules so that the plurality of substrates are serially transferred to the process modules according to the generated transfer plan.

8 Claims, 18 Drawing Sheets

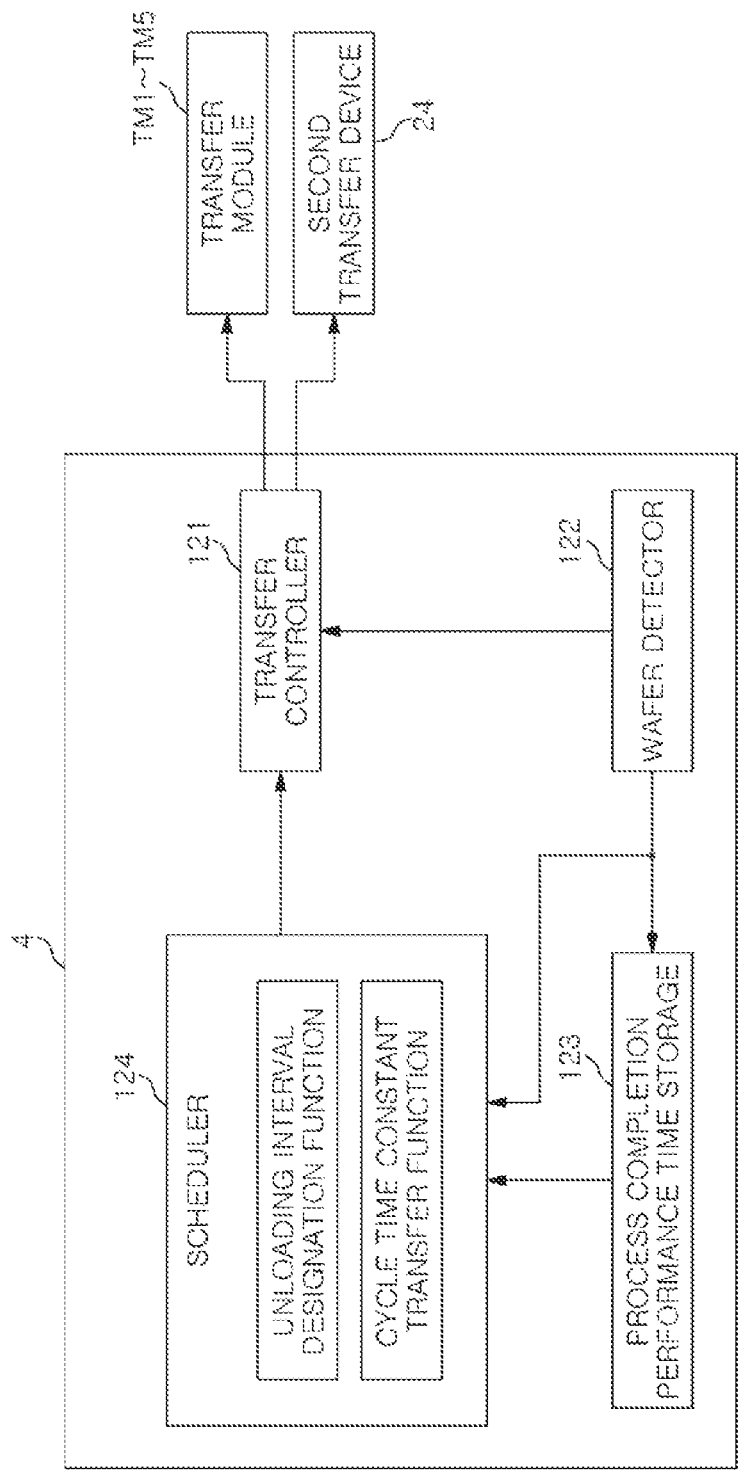

FIG.5A
FIG.5B
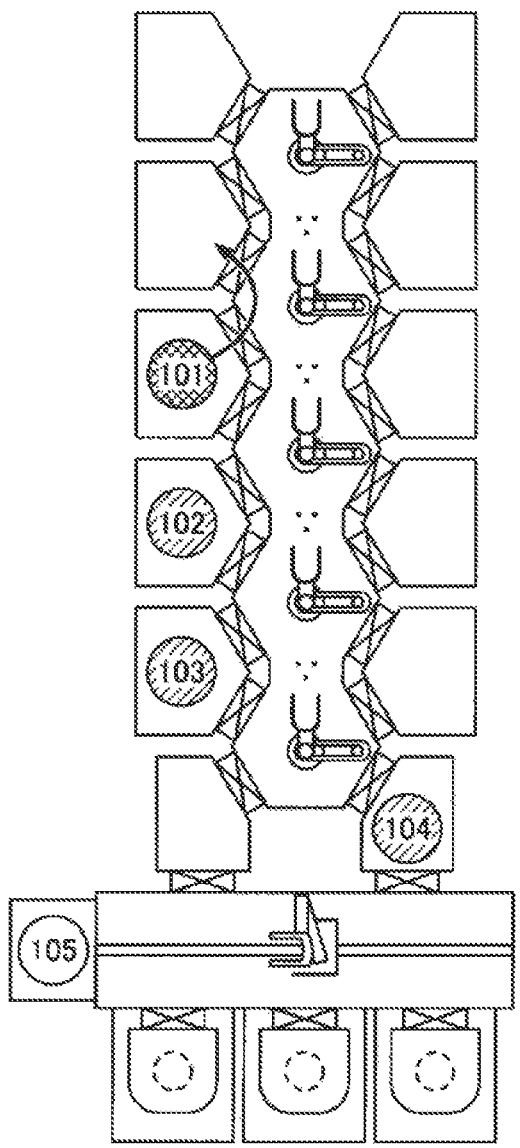
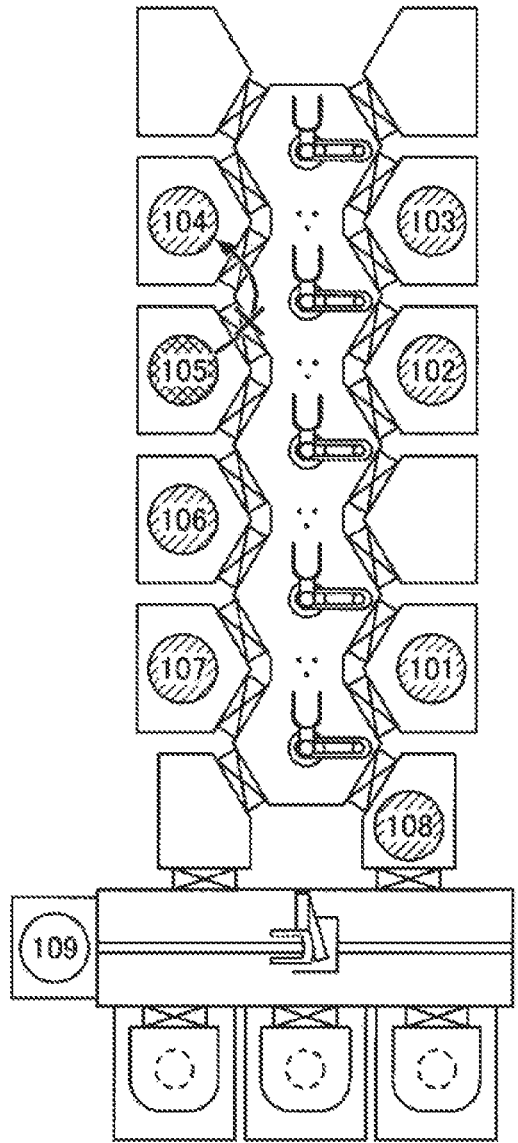

FIG. 6

FIG. 7A
FIG. 7B
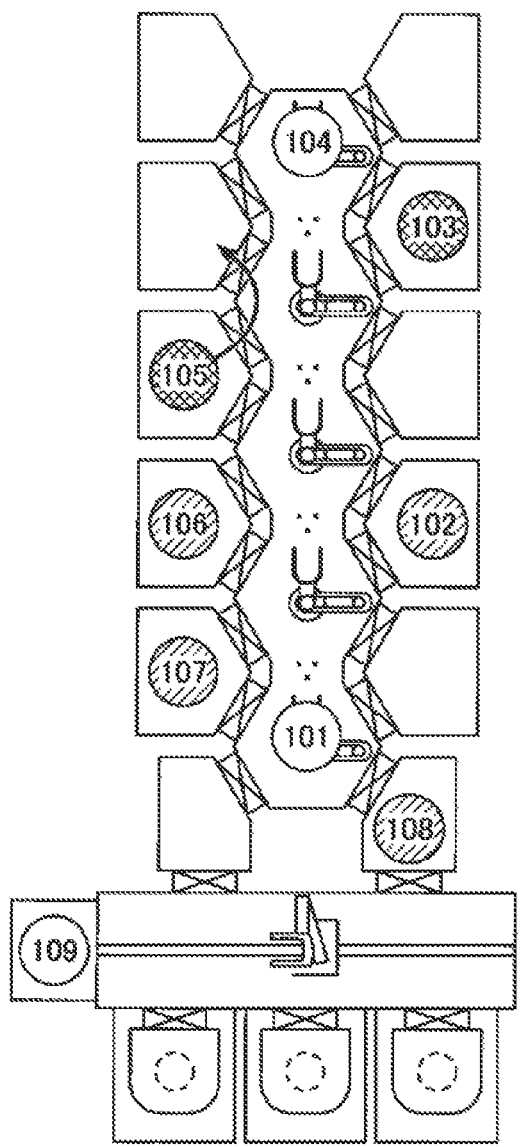
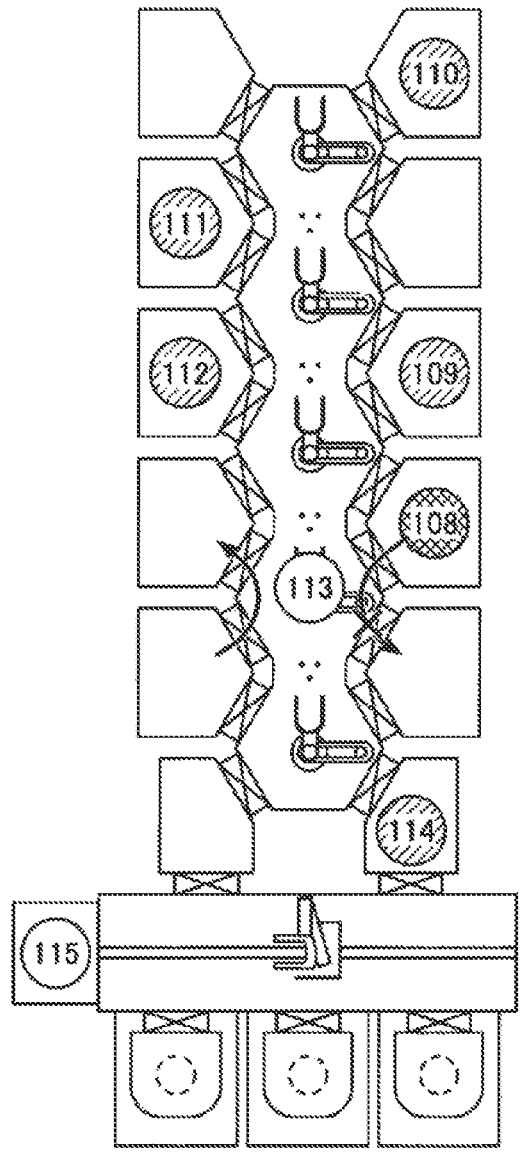

FIG. 8

FIG.11A
FIG.11B
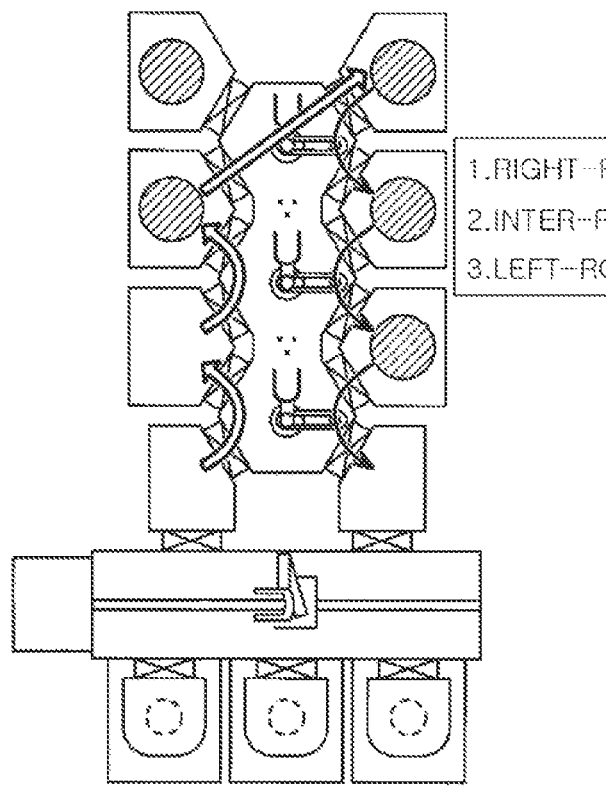
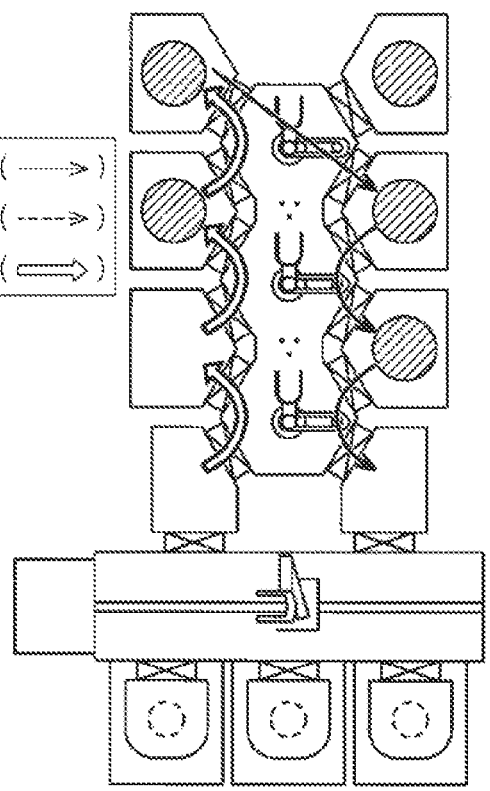

FIG. 18

SEMICONDUCTOR MANUFACTURING APPARATUS, SUBSTRATE TRANSFER METHOD, AND PROGRAM

CROSS-REFERENCE TO RELATED APPLICATIONS

This application claims priority to Japanese Patent Application No. 2020-158377, filed on Sep. 23, 2020, the entire contents of which are incorporated herein by reference.

TECHNICAL FIELD

The present disclosure relates to a semiconductor manufacturing apparatus, a substrate transfer method, and a program.

BACKGROUND

For example, with regard to a plurality of process modules which respectively perform predetermined processes, when a substrate is sequentially transferred and a series of processes is performed on the substrate, it is possible to suppress decrease in throughput and variations in processing results on the substrate according to a known technique (e.g., see Japanese Patent Application Publication No. 2020-9837).

SUMMARY

The present disclosure provides a technology for suppressing variations in processing results for a plurality of substrates when a plurality of substrates are serially transferred to perform a desired process.

In accordance with an aspect of the present disclosure, there is provided a semiconductor manufacturing apparatus including a plurality of process modules for performing desired processes on a plurality of substrates and a plurality of transfer modules for serially transferring the plurality of substrates to the plurality of process modules is provided. The semiconductor manufacturing apparatus comprises a scheduler for calculating a cycle time so that a difference in time required for each of the desired processes is within an allowable time range and generating a transfer plan for the plurality of substrates based on the cycle time, and a transfer controller for controlling the plurality of transfer modules so that the plurality of substrates are serially transferred to the process modules according to the generated transfer plan.

BRIEF DESCRIPTION OF THE DRAWINGS

FIG. 4 is a functional block diagram of an example of the controller of the semiconductor manufacturing apparatus according to the present embodiment.

FIGS. 5A and 5B are diagrams of an example describing the control of serial transfer according to a wafer transfer plan generated without using an unloading interval designation function and a cycle time constant transfer function.

FIG. 6 is a configuration diagram of an example of a process completion performance time stored in a process completion performance time storage in the case of FIG. 5.

FIGS. 7A and 7B are diagrams of an example describing the control of serial transfer according to the wafer transfer plan generated using the unloading interval designation function.

FIG. 8 is a configuration diagram of an example of the process completion performance time stored in the process completion performance time storage in the case of FIG. 7.

FIGS. 11A and 11B are diagrams showing an example of two-phase transfer.

FIG. 18 is a configuration diagram of an example of the process completion performance time stored in the process completion performance time storage in the case of FIG. 9.

DETAILED DESCRIPTION

Hereinafter, embodiments of the present invention will be described with reference to the accompanying drawings.

Figure 1:
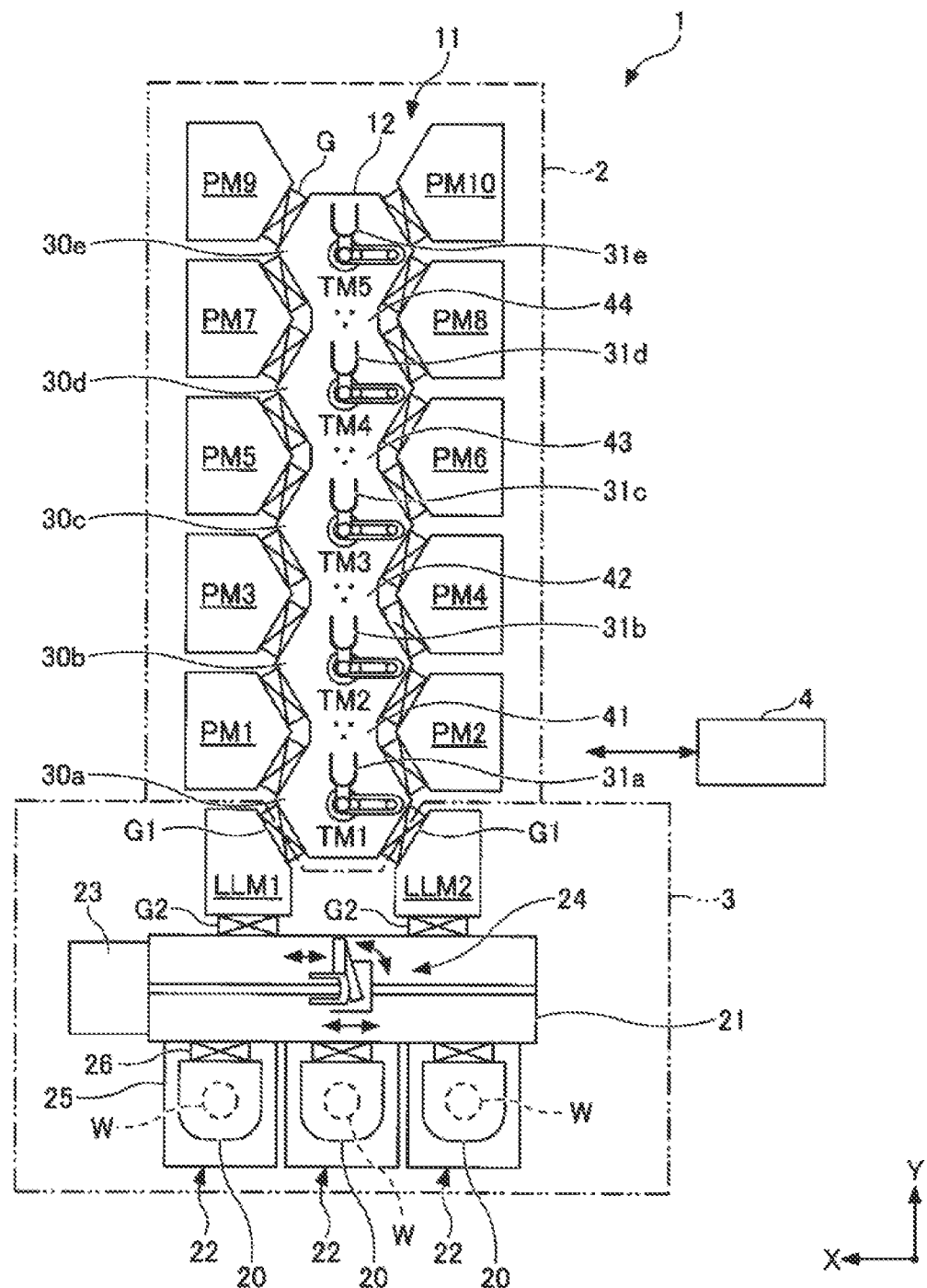
FIG. 1 is a schematic cross-sectional view of an example of a semiconductor manufacturing apparatus according to the present embodiment.

FIG. 1 is a schematic cross-sectional view of an example of a semiconductor manufacturing apparatus according to the present embodiment. A semiconductor manufacturing apparatus 1 performs a plurality of processings (a desired process such as etching, film formation, and ashing) on a substrate W. The semiconductor manufacturing apparatus 1 includes a processor 2, a loader/unloader 3, and a controller 4. The substrate W is not particularly limited, but is, for example, a semiconductor wafer (hereinafter, simply referred to as a wafer).

The loader/unloader 3 loads/unloads a substrate using a wafer as an example to the processor 2. The processor 2 includes a plurality of process modules PM1 to PM10 (ten modules in the embodiment) that perform desired vacuum processing on the wafer. Wafers are serially transferred (sequentially transferred) by a first transfer device 11 to the plurality of process modules PM1 to PM10.

The first transfer device 11 includes a plurality of transfer modules TM1 to TM5. The transfer modules TM1 to TM5 include containers $30a$, $30b$, $30c$, $30d$, and $30e$, which are maintain in a vacuum state and have a hexagonal plane shape, respectively. In addition, the transfer modules TM1 to TM5 respectively include transfer mechanisms $31a$, $31b$, 31c, 31d, and 31e having an articulated structure and provided in the containers 30a, 30b, 30c, 30d, and 30e.

Transfer sections 41, 42, 43, and 44 as transfer buffers are provided between the transfer mechanisms 31a, 31b, 31c, 31d, and 31e of the transfer modules TM1 to TM5, respectively. The containers 30a, 30b, 30c, 30d, and 30e of the transfer modules TM1 to TM5 communicate with each other to form one transfer chamber 12. The transfer chamber 12 extends in a Y-direction in the drawing. Five of the process modules PM1 to PM10 are connected to both sides of the transfer chamber 12 with an openable/closable gate valve G interposed therebetween. The gate valves G of the process modules PM1 to PM10 are opened when the transfer modules TM1 to TM5 access the process modules PM1 to PM10 and are closed when the desired process is performed.

The loader/unloader 3 is connected to one end side of the processor 2. The loader/unloader 3 includes an atmospheric transfer chamber (EFEM) 21, three load ports 22, an aligner module 23, two load lock modules LLM1 and LLM2, and a second transfer device 24. The atmospheric transfer chamber 21 is connected to the load port 22, the aligner module 23, and the load lock modules LLM1 and LLM2. In addition, the second transfer device 24 is provided in the atmospheric transfer chamber 21.

The atmospheric transfer chamber 21 has a rectangular parallelepiped shape with an X direction in the drawing as a longitudinal direction. The three load ports 22 are provided on a long side wall portion of the atmospheric transfer chamber 21 on a side opposite to the processor 2. Each of the load ports 22 has a mounting table 25 and a transfer port 26. A FOUP 20, which is a substrate container for accommodating a plurality of wafers, is mounted on the mounting table 25. The FOUP 20 on the mounting table 25 is connected to the atmospheric transfer chamber 21 in a sealed state with the transfer port 26 interposed therebetween. The aligner module 23 is connected to one short side wall portion of the atmospheric transfer chamber 21. Wafer alignment is performed in the aligner module 23.

The two load lock modules LLM1 and LLM2 are for enabling wafer transfer between the atmospheric transfer chamber 21 having an atmospheric pressure and the transfer chamber 12 having a vacuum atmosphere, and the two load lock modules LLM1 and LLM2 have a variable pressure between the atmospheric pressure and the vacuum similar to that of the transfer chamber 12. The two load lock modules LLM1 and LLM2 each have two transfer ports. One of the transfer ports is connected to a long side wall portion on the processor 2 side of the atmospheric transfer chamber 21 with a gate valve G2 interposed therebetween. The other transfer port is connected to the transfer chamber 12 of the processor 2 with a gate valve G1 interposed therebetween.

The load lock module LLM1 is used when the wafer is transferred from the loader/unloader 3 to the processor 2. The load lock module LLM2 is used when the wafer is transferred from the processor 2 to the loader/unloader 3. In addition, the load lock modules LLM1 and LLM2 may be used for processing such as degas processing.

The second transfer device 24 in the atmospheric transfer chamber 21 has an articulated structure and performs wafer transfer to the FOUP 20 on the load port 22, the aligner module 23, and the load lock modules LLM1 and LLM2. Specifically, the second transfer device 24 takes an unprocessed wafer out of the FOUP 20 of the load port 22 and transfers the wafer to the aligner module 23, and transfers the wafer from the aligner module 23 to the load lock module LLM1. In addition, the second transfer device 24 receives a processed wafer transferred from the processor 2 to the load lock module LLM2 and transfers the wafer to the FOUP 20 of the load port 22. Although FIG. 1 shows an example in which one pick receives a wafer of the second transfer device 24, the number of picks may be two.

In addition, a transferer of the semiconductor manufacturing apparatus 1 is composed of the first transfer device 11 and the second transfer device 24. In the processor 2, the process modules PM1, PM3, PM5, PM7, and PM9 are disposed on one side of the transfer chamber 12 in order from the load lock module LLM1 side, and the process modules PM2, PM4, PM6, PM8, and PM10 are disposed on the other side of the transfer chamber 12 in order from the load lock module LLM2 side. In the first transfer device 11, the transfer modules TM1, TM2, TM3, TM4, and TM5 are disposed in order from the load lock modules LLM1 and LLM2.

The transfer mechanism 31a of the transfer module TM1 may access the load lock modules LLM1 and LLM2, the process modules PM1 and PM2, and the transfer section 41. The transfer mechanism 31b of the transfer module TM2 may access the process modules PM1, PM2, PM3, and PM4 and the transfer sections 41 and 42.

The transfer mechanism 31c of the transfer module TM3 may access the process modules PM3, PM4, PM5, and PM6 and the transfer sections 42 and 43. The transfer mechanism 31d of the transfer module TM4 may access the process modules PM5, PM6, PM7, and PM8 and the transfer sections 43 and 44. The transfer mechanism 31e of the transfer module TM5 may access the process modules PM7, PM8, PM9, and PM10 and the transfer section 44.

Figure 2:
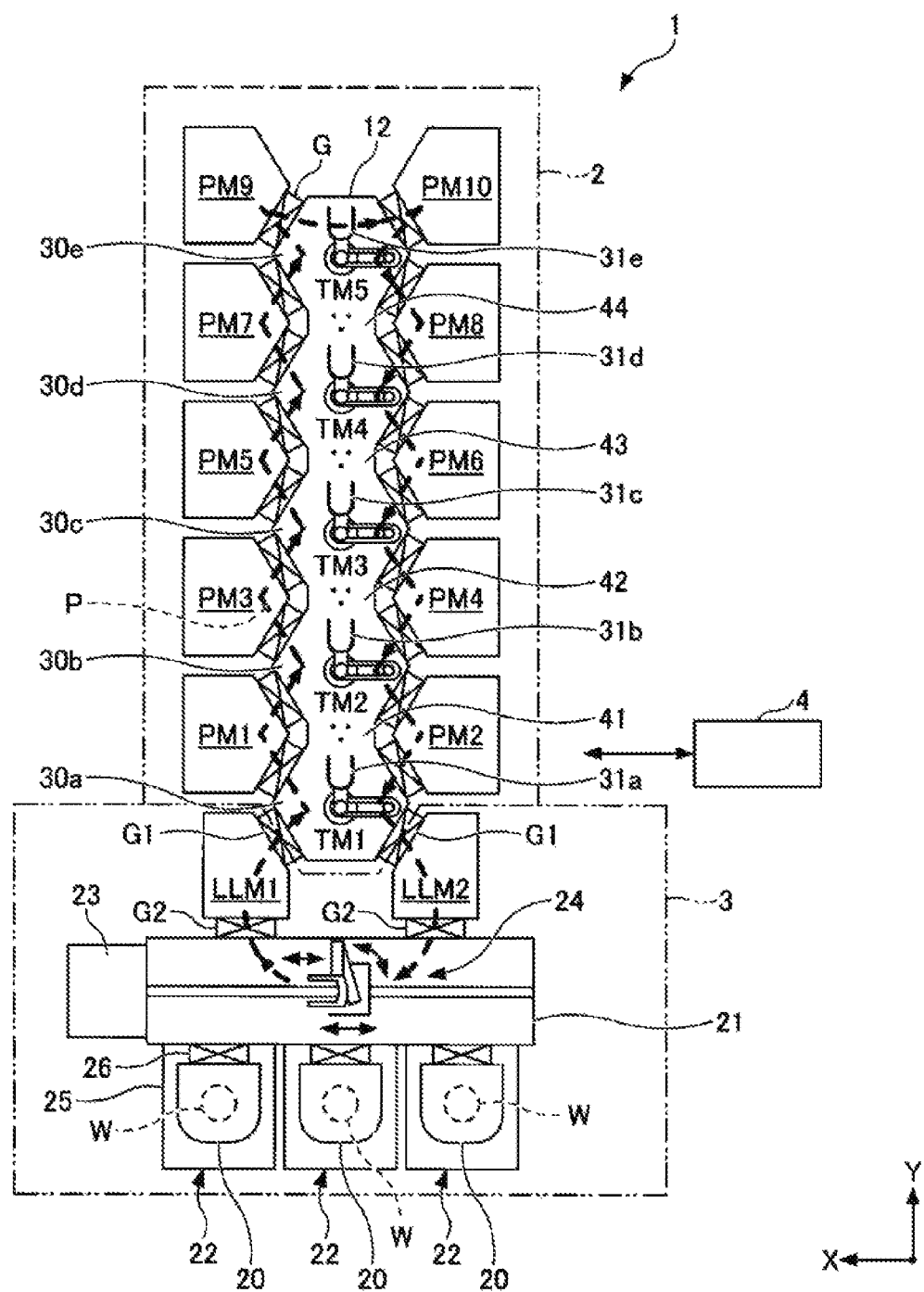
FIG. 2 is a schematic cross-sectional view showing an example of a wafer transfer path of the semiconductor manufacturing apparatus according to the present embodiment.

The transfer modules TM1 to TM5 of the second transfer device 24 and the first transfer device 11 are configured as shown in FIG. 1. Therefore, as shown in FIG. 2, the wafer taken out of the FOUP 20 is serially transferred in one direction along a substantially U-shaped path P in the processor 2 and processed by the process modules PM1 to PM10, and returned to the FOUP 20. That is, the wafers are serially transferred in the order of the process modules PM1, PM3, PM5, PM7, PM9, PM10, PM8, PM6, PM4, and PM2, and desired processes are performed.

The semiconductor manufacturing apparatus 1 may be used, for example, for manufacturing a stacked film (MTJ film) used for a magnetoresistive random access memory (MRAM). For manufacturing MTJ films, there are a plurality of desired processes such as pre-cleaning process, film formation process, oxidation process, heat process, and cooling process. Each desired process is performed in the process modules PM1 to PM10. One or more of the process modules PM1 to PM10 may be standby modules for allowing the wafer to wait.

The controller 4 controls each component of the semiconductor manufacturing apparatus 1, for example, the transfer modules TM1 to TM5 (the transfer mechanisms 31a to 31e), the second transfer device 24, the process modules PM1 to PM10, the load lock modules LLM1 and LLM2, the transfer chamber 12, and the gate valves G, G1 and G2. The controller 4 is, for example, a computer.

Figure 3:
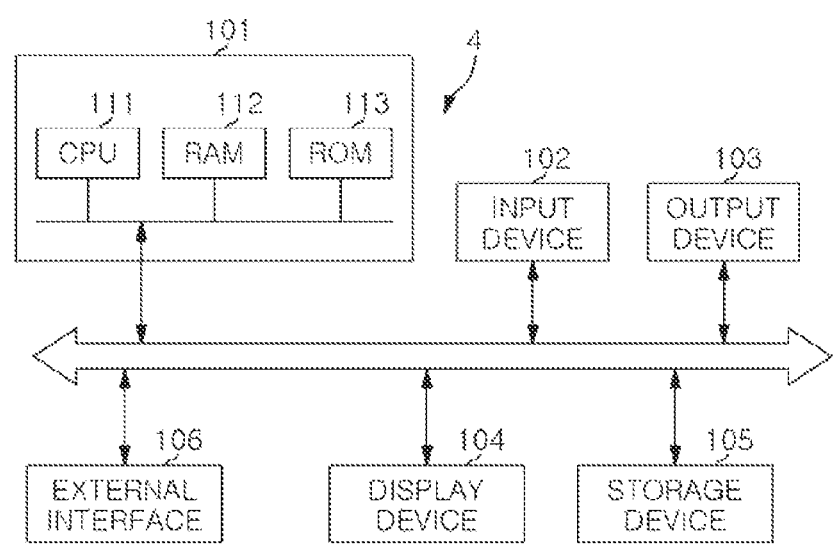
FIG. 3 is a hardware configuration diagram of an example of a controller of the semiconductor manufacturing apparatus according to the present embodiment.

FIG. 3 is a hardware configuration diagram of an example of the controller. The controller 4 of FIG. 3 includes a main controller 101, an input device 102, an output device 103, a display device 104, a storage device 105, an external interface 106, and a bus 107 that connects them to each other. The input device 102 is a keyboard, a mouse, a touch panel, or the like. The output device 103 is a printer or the like. The display device 104 is a display or the like.

The main controller 101 includes a central processing unit (CPU) 111, a random access memory (RAM) 112, and a read only memory (ROM) 113. The storage device 105 performs a function of writing and reading programs and information necessary for control. The storage device 105 includes a computer-readable storage medium such as a hard disk drive (HDD). A recipe for a desired process on the wafer is stored in the storage medium.

In the controller 4, the CPU 111 executes a program stored in the ROM 113 or the storage medium of the storage device 105 using the RAM 112 as a work region to cause the semiconductor manufacturing apparatus 1 to process the wafer.

FIG. 4 is a functional block diagram of an example of the controller. FIG. 4 mainly shows a transfer control function of a wafer. The controller 4 includes a transfer controller 121, a wafer detector 122, a process completion performance time storage 123, and a scheduler 124. In addition, although the controller 4 has functions other than the transfer control function, illustration and description thereof will be omitted here.

The transfer controller 121 controls the transfer modules TM1 to TM5 (transfer mechanisms 31a to 31e) and the second transfer device 24 according to the wafer transfer plan described later and generated by the scheduler 124. Specifically, the transfer controller 121 controls so that the wafer is unloaded from the FOUP 20 and reaches the processor 2 via the aligner module 23 and the load lock module LLM1. In addition, the transfer controller 121 controls the wafer to be serially transferred to each of the process modules PM1 to PM10 in the order shown in FIG. 2. In addition, the transfer controller 121 controls the wafer to return to the FOUP 20 via the load lock module LLM2.

The wafer detector 122 detects a position of the wafer in the semiconductor manufacturing apparatus 1. The position of the wafer detected by the wafer detector 122 and a residence time at the position are stored in the process completion performance time storage 123. The position of the wafer detected by the wafer detector 122 may be displayed on a device screen of the display device 104. In addition, the position of the wafer detected by the wafer detector 122 may be notified to the transfer controller 121 and the scheduler 124.

The process completion performance time storage 123 stores the time required for each of the desired processes (process completion performance time). As will be described later, the process completion performance time may be expressed by a performance time of the desired process and a performance time of the transfer processing. The performance time of the desired process and the performance time of the transfer processing may be calculated from the position of the wafer detected by the wafer detector 122 and the residence time at the position.

The scheduler 124 generates a wafer transfer plan so as to suppress variations in the time that each wafer stays in the process modules PM1 to PM10 by the unloading interval designation function and the cycle time constant transfer function described later.

Hereinafter, in order to facilitate understanding of the embodiment, a control of serial transfer according to a wafer transfer plan generated without using the unloading interval designation function and the cycle time constant transfer function described later, a wafer transfer plan generated using the unloading interval designation function described later, and a wafer transfer plan generated using the unloading interval designation function and the cycle time constant transfer function described later will be described in detail.

FIG. 5 is a diagram of an example describing the control of serial transfer according to the wafer transfer plan generated without using the unloading interval designation function and the cycle time constant transfer function. In addition, FIG. 5 schematically shows the semiconductor manufacturing apparatus 1 shown in FIGS. 1 and 2. Here, an example of the longest process time (maximum process time) of the process module PM7 will be described.

In the example of FIG. 5, after the desired process, if possible, the wafer is immediately unloaded from the process modules PM1 to PM10. Therefore, in the example of FIG. 5, a wait occurs before the process module PM7 having the maximum process time.

In FIG. 5A, there is no wafer in the process module PM7, and a first wafer "101" is immediately loaded into the process module PM7 after the desired process in the process module PM5 is completed. In FIG. 5B, since the process module PM7 has a wafer "104" for which the desired process has not been completed, a fifth wafer "105" may not be immediately loaded into the process module PM7 even though the desired process in the process module PM5 is completed. As described above, in the example of FIG. 5, a residence time in the process modules PM1, PM3, and PM5 prior to the process module PM7 becomes different (irregular) between the first wafer and the second and subsequent wafers, and there is a possibility that variations in process results between wafers occur.

Figure 6:
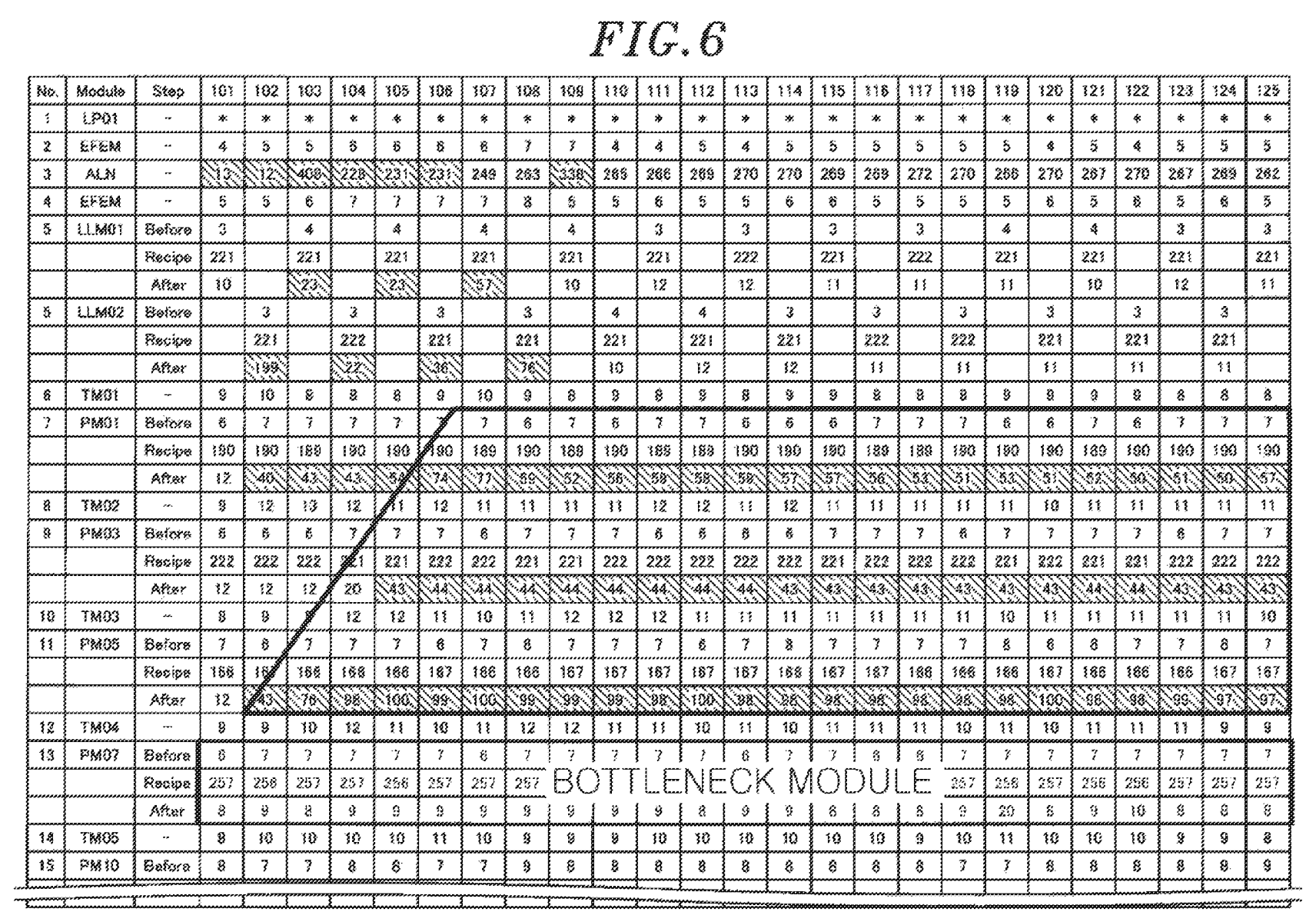

FIG. 6 is a configuration diagram of an example of the process completion performance time stored in the process completion performance time storage in the case of FIG. 5. A vertical axis of FIG. 6 indicates various modules in which wafers are serially transferred in the order in which wafers are serially transferred. A horizontal axis of FIG. 6 indicates the wafers on which the desired process is performed in the order in which the desired process is performed. In addition, "Before" on the vertical axis of FIG. 6 indicates a loading time into various modules. "After" on the vertical axis of FIG. 6 indicates an unloading time from various modules. "Recipe" on the vertical axis of FIG. 6 indicates a process time in various modules.

In addition, since the process module PM7 is an example of the maximum process time in FIG. 6, the process module PM7 is described as a "bottleneck module". For example, referring to the unloading time "After" of the process module PM5 in front of the process module PM7 in FIG. 6, it can be seen that the unloading time of the first wafer "101" is "12 seconds", but it takes "43 seconds or more" for the second and subsequent wafers.

As described above, in the control of the serial transfer shown in FIGS. 5 and 6, a wait occurs before the process module PM7 having a long process time, and a residence time between the first wafer and the second and subsequent wafers becomes different.

FIG. 7 is a diagram of an example describing the control of serial transfer according to the wafer transfer plan generated using the unloading interval designation function. In addition, FIG. 7 schematically shows the semiconductor manufacturing apparatus 1 shown in FIGS. 1 and 2. Here, an example of the longest process time (maximum process time) of the process module PM7 will be described. The unloading interval designation function is a function in which the unloading interval of the wafer from the load port 22 is set to a designated time.

In FIG. 7A, there is no wafer in the process module PM7, and the fifth wafer "105" is immediately loaded into the process module PM7 after the desired process in the process module PM5 is completed. In this way, in the example of FIG. 7A, a wait does not occur before the process module PM7 having the maximum process time.

However, in the control of serial transfer according to the wafer transfer plan generated using the unloading interval designation function, as shown in FIG. 7B, there is a timing in which the transfer modules TM1, TM2, TM3, TM4, and TM5 are contending with each other. In the example of FIG. 7B, a wafer "113" is transferred from the process module PM1 to the process module PM3. Accordingly, a wafer "108" transferred from the process module PM4 to the process module PM2 waits until the transfer of the wafer "113" is completed.

As described above, in the example of FIG. 7, a wait may occur due to the contention of the transfer modules TM1, TM2, TM3, TM4, and TM5, and a residence time becomes different (irregular) between a wafer which was waiting for transfer and a wafer which was not waiting for transfer, and there is a possibility that variations in process results between wafers occur.

Figure 8:
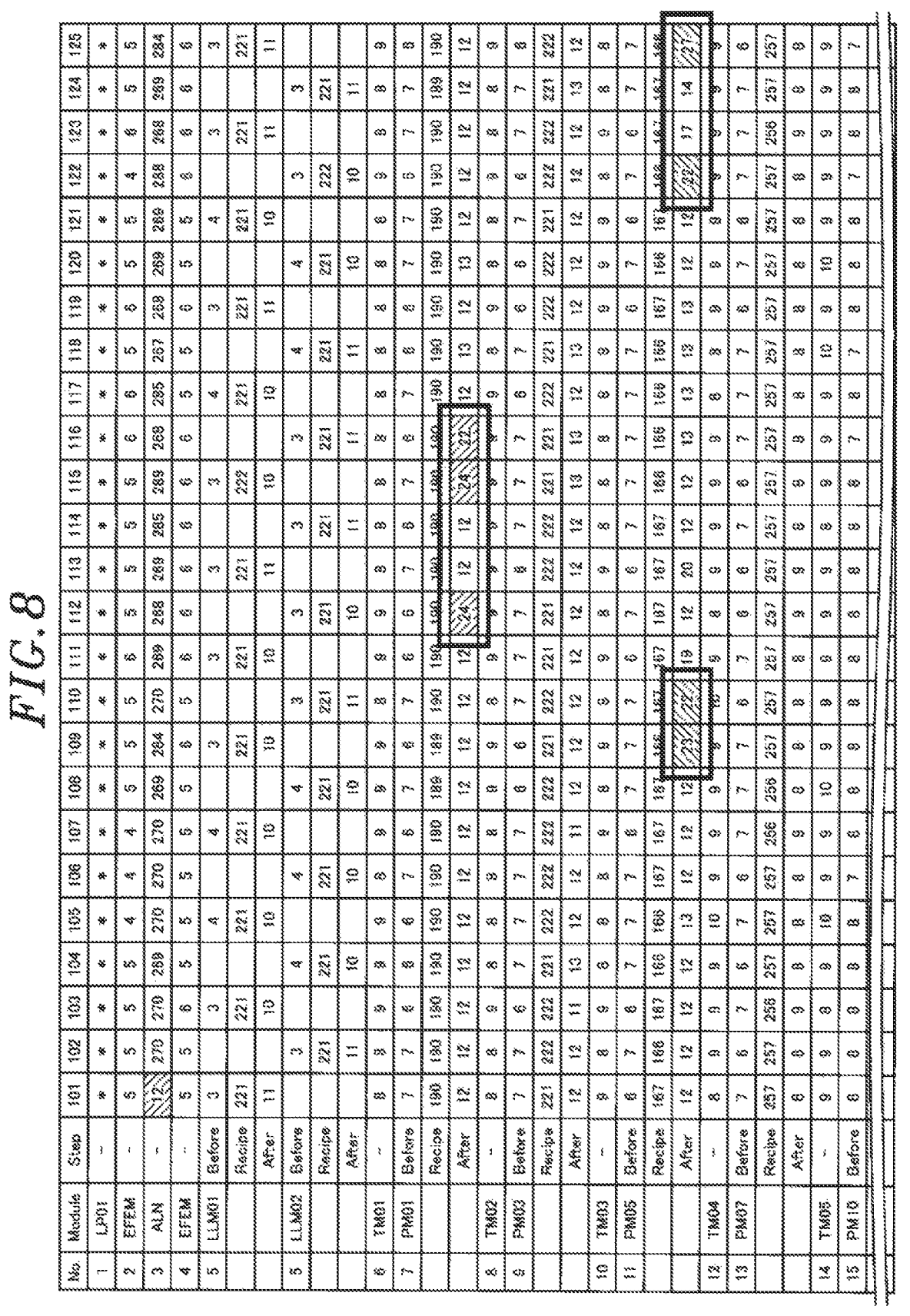

FIG. 8 is a configuration diagram of an example of the process completion performance time stored in the process completion performance time storage in the case of FIG. 7. As in FIG. 6, a vertical axis of FIG. 8 indicates various modules in which wafers are serially transferred in the order in which wafers are serially transferred. As in FIG. 6, a horizontal axis of FIG. 8 indicates the wafers on which the desired process is performed in the order in which the desired process is performed.

FIG. 8 shows an example of the process module PM7 having the maximum process time, but a wait does not occur before the process module PM7 as shown in FIG. 6. However, in FIG. 8, it can be seen that a wait due to the contention of the transfer modules TM1, TM2, TM3, TM4, and TM5 is, for example, an unloading time of wafers "112", "115", and "116" of the process module PM1 or an unloading time of wafers "109", "110", "122" and "125" of the process module PM5, which is longer than that of other wafers.

As described above, in the control of the serial transfer shown in FIGS. 7 and 8, a wait occurs due to the contention between the transfer modules TM1, TM2, TM3, TM4, and TM5, and the residence time differs depending on whether or not the wait occurs.

FIG. 9 is a diagram of an example describing the control of serial transfer according to a wafer transfer plan generated using the unloading interval designation function and the cycle time constant transfer function. In addition, FIG. 9 schematically shows the semiconductor manufacturing apparatus 1 shown in FIGS. 1 and 2. Here, an example of the longest process time (maximum process time) of the process module PM7 will be described. The cycle time constant transfer function is a function of transferring a wafer in accordance with a rhythm of a phase so that contention between the transfer modules TM1, TM2, TM3, TM4, and TM5 does not arise.

Figure 10:
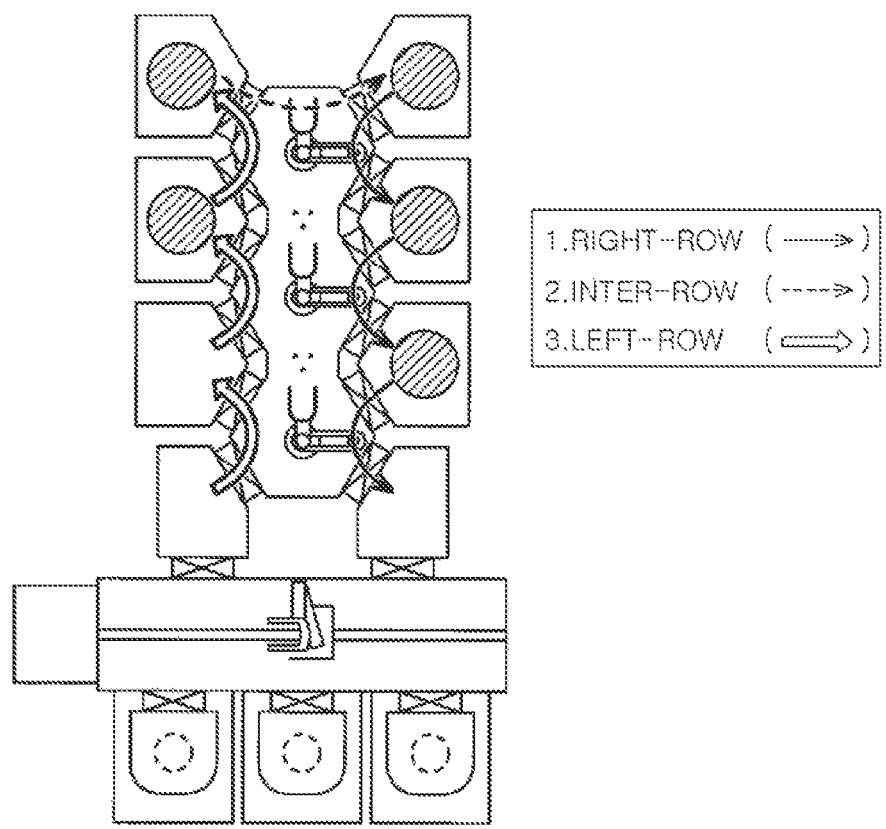
FIG. 10 is a diagram of an example describing a phase of the cycle time constant transfer function.

First, the phase of the cycle time constant transfer function is defined with reference to FIG. 10. FIG. 10 is a diagram of an example describing the phase of the cycle time constant transfer function. FIG. 10 shows an example of three-phase transfer of right-row transfer, inter-row transfer, and left-row transfer, and a series of transfer blocks such as right-row transfer, inter-row transfer, and left-row transfer is called the phase.

Figure 9A:
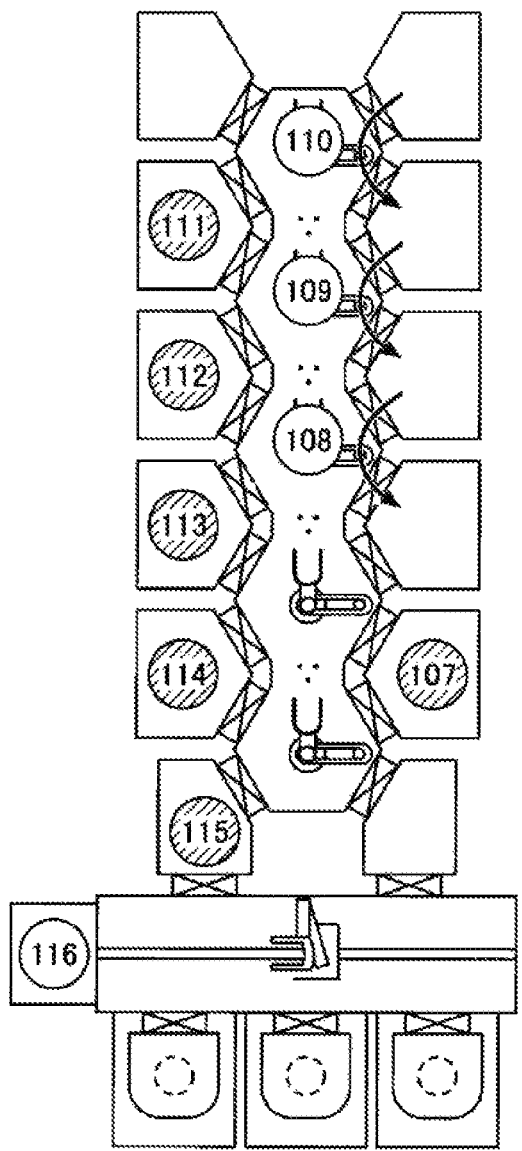
FIGS. 9A and 9B are diagrams of an example describing the control of serial transfer according to a wafer transfer plan generated using the unloading interval designation function and the cycle time constant transfer function.
Figure 9B:
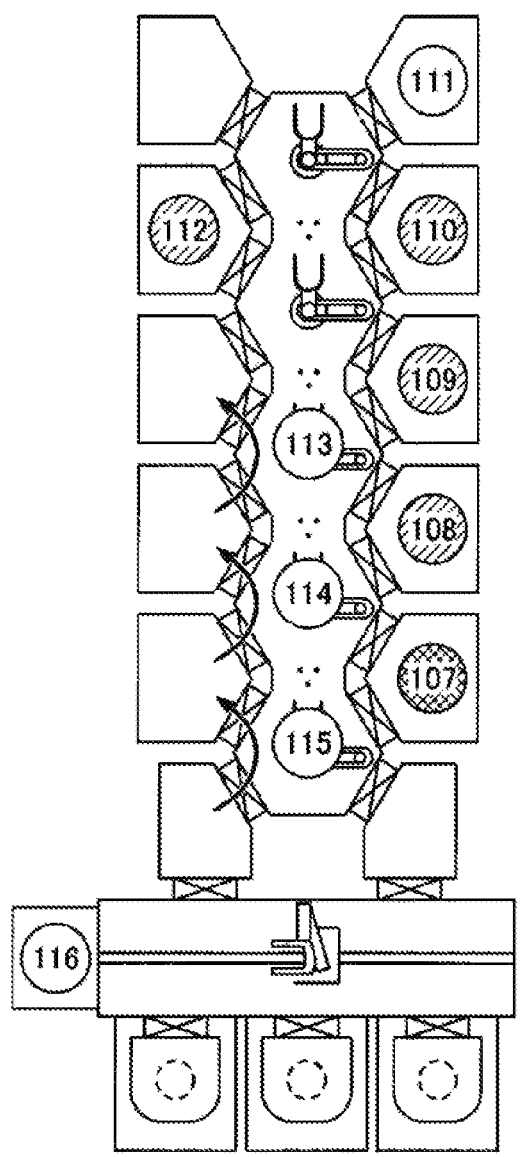

The contention of the transfer module TM2 as shown in FIG. 7B occurs when wafers may be simultaneously transferred in the process modules PM1 and PM4 that use (share) the same transfer module TM2. In order to prevent contention of the transfer modules TM1, TM2, TM3, TM4, and TM5 shown as an example in FIG. 7B, in the cycle time constant transfer function of FIG. 9, the wafers are transferred in a flow of the right-row transfer for transferring wafers of the right-row process modules PM2, PM4, PM6, PM8, and PM10, the inter-row transfer for transferring wafers from the process module PM9 to the process module PM10, and the left-row transfer for transferring wafers of the left-row process modules PM1, PM3, PM5, PM7, and PM9. FIG. 9A shows a state of the right-row transfer. FIG. 9B shows a state of the left-row transfer.

As shown in FIGS. 9A and 9B, in the case of serial transfer only for the left-row transfer and serial transfer only for the right-row transfer, the transfer modules TM1, TM2, TM3, TM4, and TM5 are not shared and there is no contention.

The transfer modules TM1, TM2, TM3, TM4, and TM5 have a timing at which they may be serially transferred all at once in accordance with the desired process of the wafer. The phase is a summary of the timing at which serial transfer may be performed at the same time. For example, in the cycle time constant transfer function shown in FIG. 10, all wafers may be continuously transferred in a constant cycle by serially transferring wafers in accordance with phases of right-row transfer→inter-row transfer→left-row transfer.

FIG. 10 shows an example of serial transfer in which wafers are transferred in a U shape in the order of the process modules PM1, PM3, PM5, PM6, PM4, and PM2. For example, in FIG. 10, the serial transfer is broken down into three phases of the process modules PM2, PM4, and PM6 of the right-row transfer, the process module PM5 of the inter-row transfer, and the process modules PM1 and PM3 of the left-row transfer to perform three-phase transfer. The process module PM5 in the case of FIG. 10 becomes a boundary process module described later.

The three-phase transfer is an example of a transfer pattern, and two-phase transfer and four-phase transfer are also possible. FIG. 11 is a diagram showing an example of two-phase transfer. In the example of FIG. 11, an example of two-phase transfer, which is a U-shaped transfer excluding one process module of the last stage, is shown. FIG. 11A shows an example of two-phase transfer excluding the process module PM5. In addition, FIG. 11B is an example of two-phase transfer excluding the process module PM6. In the two-phase transfer shown in FIG. 11, inter-row transfer is performed simultaneously with right-row transfer or left-row transfer by using the same transfer module TM3 twice in succession.

Figure 12:
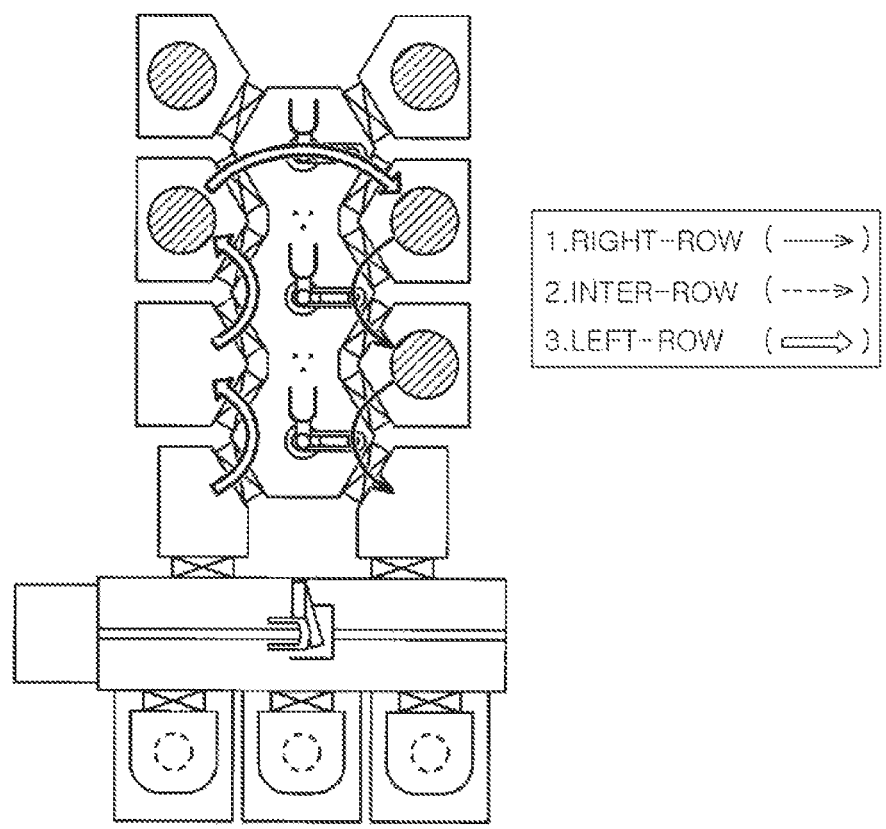
FIG. 12 is a diagram showing another example of two-phase transfer.

FIG. 12 is a diagram showing another example of two-phase transfer. In the example of FIG. 12, an example of two-phase transfer, which is a U-shaped transfer that does not use the process module of the last stage, is shown. In the two-phase transfer shown in FIG. 12, inter-row transfer may be performed at the same time as right-row transfer or left-row transfer by using the transfer module TM3 only for inter-row transfer.

Although four-phase transfer is not shown in the drawing, when using PASS at the last stage, it becomes the four-phase transfer. In the four-phase transfer, for example, the same transfer module TM3 is used four times in a row. In addition, although an example of clockwise serial transfer is shown in the embodiment, it may also be applied to counterclockwise serial transfer.

Next, the cycle time in the cycle time constant transfer function is defined. The cycle time in the cycle time constant transfer function is the time required for the process for each of the desired processes. The cycle time is the time from the start of wafer transfer of each of the desired processes to the completion of wafer transfer.

In the cycle time constant transfer function according to the embodiment, the waiting time is adjusted so that the cycle time of each of the desired processes becomes constant. The cycle time of the desired process may be calculated by the process time, the transfer time, and the waiting time as described below. The cycle time of the desired process is different in a normal process module and a phase boundary process module.

In addition, the normal process module is a process module other than the phase boundary process module. The cycle time of the normal process module is calculated so that a rhythm of wafer unloading from the process module matches. The cycle time of the phase boundary process module is calculated to be shorter than that of the normal process module by one transfer time.

The phase boundary process module is defined as follows, for example, in a part of three-phase transfer, four-phase transfer, and two-phase transfer in which the same transfer module is continuously used. The phase boundary transfer module is defined as a transfer module that is continuously used in the wafer transfer plan. In addition, the phase boundary process module is defined as a process module sandwiched between the phase boundary transfer modules. For example, in an example shown in FIG. 10, since the transfer module TM3 is continuously used, the transfer module TM3 serves as the phase boundary transfer module. In addition, in the example shown in FIG. 10, the process module PM5 sandwiched between the serial transfers of the transfer module TM3, which is the phase boundary transfer module, serves as the phase boundary process module.

In addition, the phase boundary process module is defined as follows, for example, in the two-phase transfer as shown in FIG. 12 in which the same transfer module is not continuously used. In addition, a corresponding condition corresponds to a case in which one transfer module has been used once and the number of times of use of the remaining transfer modules is two when counting the number of times of use of the transfer modules.

The phase boundary transfer module is defined as the innermost transfer module. The phase boundary transfer module may be defined as a transfer module that has been used once. In addition, the phase boundary process module is defined as the immediate unloading process module described later, or a module with a shorter predicted process time when not all have immediate unloading specifications among the process modules in which wafers are loaded or unloaded by the phase boundary transfer module.

For example, in the example of FIG. 12, the phase boundary process module is selected from the process modules PM3 and PM4 according to whether it is the immediate unloading process module, or the predicted process time when not all have immediate unloading specifications.

As described above, in the cycle time constant transfer function according to the embodiment, the waiting time is adjusted so that the cycle time of the desired process of each of the normal process modules is constant (a difference in the cycle time of the desired process of each of the normal process modules is within an allowable time range). However, the process module includes a process module that needs to quickly unload the wafer after a desired process, such as a process module that performs oxidation in an MRAM process or the like.

In addition, according to a hardware configuration of the semiconductor manufacturing apparatus 1, there is also a temperature-dependent process module having a heater and a cooling mechanism, and thus, a process module is also included in which a timing of allowing the wafer to wait in the process module is performed before the desired process, not after the desired process.

Therefore, in the cycle time constant transfer function according to the embodiment, waiting after the process, waiting before the process, and immediate unloading are used as variations of the waiting time. The waiting after the process is assumed to be used in a process module in which being left in the process module is not cared about. In the waiting after the process, a wait for adjusting a timing of unloading the wafer from the process module is performed after the desired process.

In addition, the waiting before the process is assumed to be used in, for example, a temperature processing-dependent process module. In the waiting before the process, the wait for adjusting the timing of unloading the wafer from the process module is performed before the desired process, and the wafer unloading is quickly performed after the desired process.

In addition, in the immediate unloading, for example, like the process module performing oxidation, a process module in which a desired process result (process characteristics) is changed only by staying in the process module is assumed. In the immediate unloading, the desired process is quickly performed without waiting for adjusting the timing of unloading the wafer from the process module, and the wafer unloading is quickly performed after the desired process.

In the cycle time constant transfer function according to the embodiment, it may be possible to set by a parameter whether each process module uses either the waiting after the process, the waiting before the process, or the immediate unloading as a variation of the waiting time.

Figure 13:
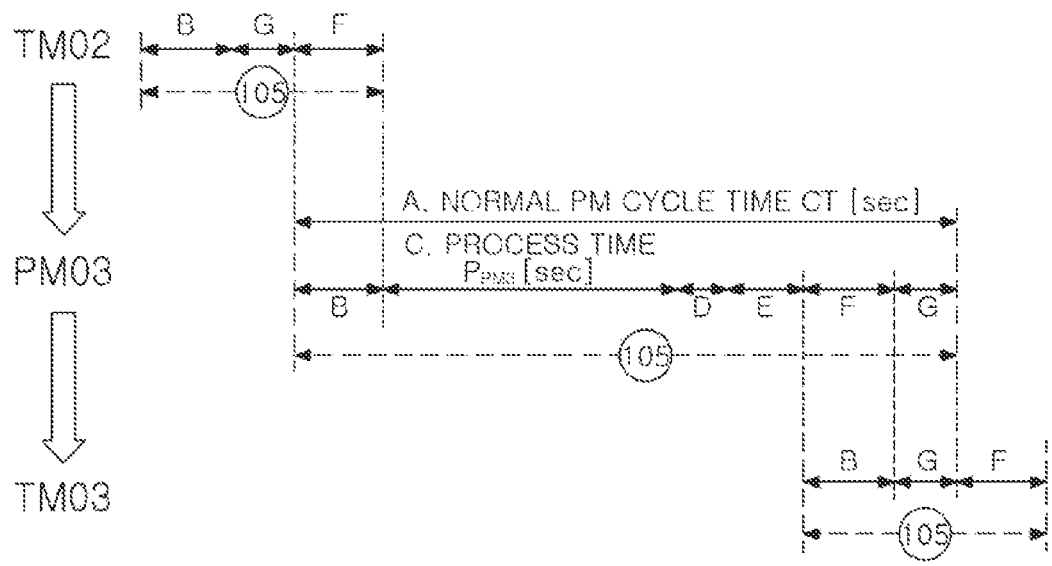
FIG. 13 is an explanatory diagram showing an example of waiting after a process.

FIG. 13 is an explanatory diagram showing an example of waiting after the process. The process module of the waiting after the process performs a wait for adjusting the timing of unloading the wafer from the process module after the desired process. In the example of FIG. 13, a time obtained by adding "E. PM waiting time Wi" and "D. waiting time in PM during cycle time constant transfer WPM" becomes a waiting time for adjusting the timing of unloading the wafer from the process module.

Figure 14:
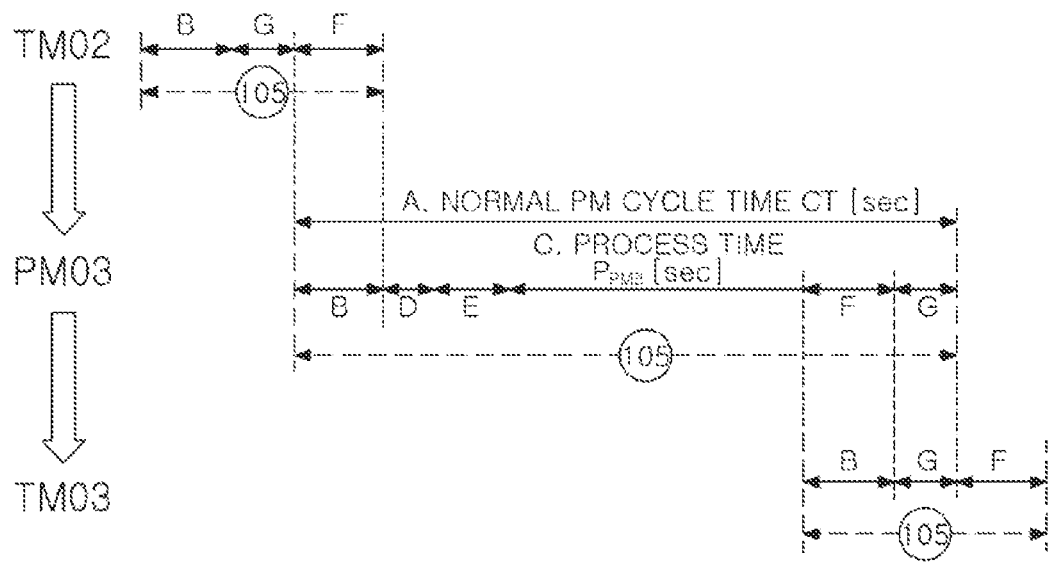
FIG. 14 is an explanatory diagram showing an example of waiting before a process.

FIG. 14 is an explanatory diagram showing an example of waiting before the process. The process module of the waiting before the process performs a wait for adjusting the timing of unloading the wafer from the process module before the desired process. In the example of FIG. 14, a time obtained by adding "E. PM waiting time Wi" and "D. waiting time in PM during cycle time constant transfer WPM" becomes a waiting time for adjusting the timing of unloading the wafer from the process module. In the waiting before the process, the wafer is quickly unloaded from the process module after the desired process.

Figure 15:
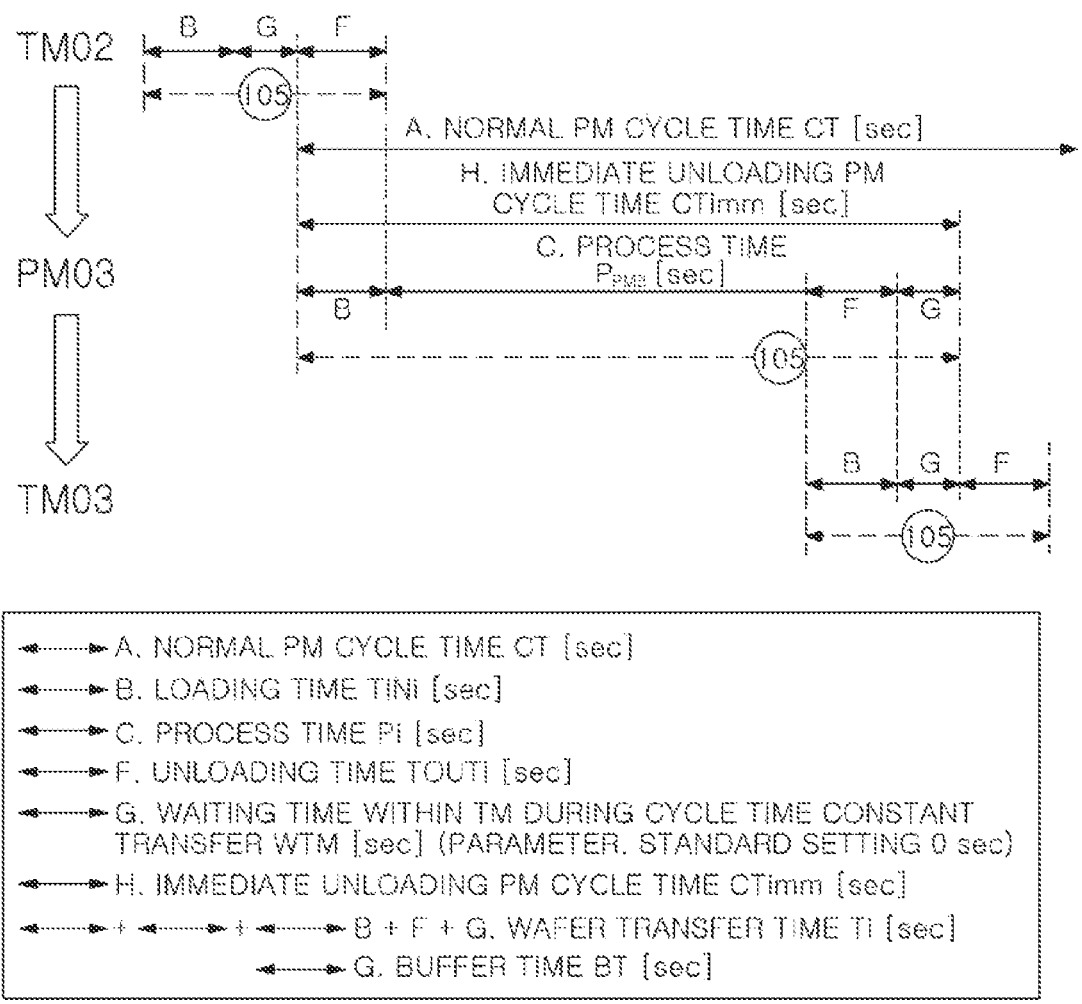
FIG. 15 is an explanatory diagram showing an example of immediate unloading.

FIG. 15 is an explanatory diagram showing an example of immediate unloading. A process module of the immediate unloading does not perform a wait for adjusting the timing of unloading the wafer from the process module, quickly performs the desired process, and quickly performs the wafer unloading after the desired process.

For this reason, in the process module of the immediate unloading, a cycle time "H. immediate unloading PM cycle time CTimm" is shorter than a cycle time of the normal process module as much as the time obtained by adding "E. PM waiting time Wi" and "D. waiting time in PM during cycle time constant transfer WPM".

As shown in FIGS. 13 to 15, the cycle time is from the start of wafer loading to the completion of wafer unloading. In the cycle time constant transfer function according to the embodiment, the cycle time of each process module is kept constant by allocating the waiting time, and the cycle time of the phase boundary process module is shortened by one transfer time, so that wafers may be serially transferred to match a rhythm of the phases. However, the process module of immediate unloading is operated at a different cycle time as shown in FIG. 15.

The cycle time of the normal process module may be calculated by, for example, the maximum process time+the maximum wafer transfer time. In addition, the cycle time of the phase boundary process module is set to be one transfer time shorter than the cycle time of the normal process module in order not to overlap the timing with other phases (for example, the right-row transfer and left-row transfer phases in FIG. 10).

For example, in the cycle time constant transfer function according to the embodiment, the cycle time of the normal process module, the cycle time of the phase boundary process module, and the cycle time of the process module of immediate unloading are calculated using the process completion performance time stored in the process completion performance time storage 123.

Here, in the example of FIG. 10, the calculation of the cycle time when the process completion performance time is under the following conditions will be described.

Transfer path: PM1→PM3→PM4→PM2

Maximum transfer time: 20 seconds

Process time: PM1) 100 seconds, PM3) 30 seconds, PM4) 40 seconds, PM2) 50 seconds Under the above conditions, the cycle time of the normal process module becomes 120 seconds from the maximum process time of 100 seconds+the maximum transfer time of 20 seconds. The boundary process module becomes the process module PM3. When the waiting time of each process module is set as the waiting time after the process, the waiting time of the process modules PM1 to PM4 is as follows.

PM1)

Waiting time 0 seconds: Process time 100 seconds+Waiting time 0 seconds+Transfer time 20 seconds=120 seconds

PM3)

Waiting time 50 seconds: Process time 30 seconds+Waiting time 50 seconds+Transfer time 20 seconds=100 seconds

PM4)

Waiting time 60 seconds: Process time 40 seconds+Waiting time 60 seconds+Transfer time 20 seconds=120 seconds

PM2)

Waiting time 50 seconds: Process time 50 seconds+Waiting time 50 seconds+Transfer time 20 seconds=120 seconds As described above, the process module PM3 is the boundary process module, and the cycle time is shorter than the cycle time of the normal process module of 120 seconds by the maximum transfer time of 20 seconds. The maximum transfer time is the maximum value of a wafer transfer time. The wafer transfer time is the sum of the wafer loading time and the wafer unloading time into/from the process module. In addition, the process time is the time for the process module to perform the desired process and includes a processing time after the wafer is loaded before the recipe is started and a processing time after the recipe is completed until the wafer can be unloaded.

Figure 16:
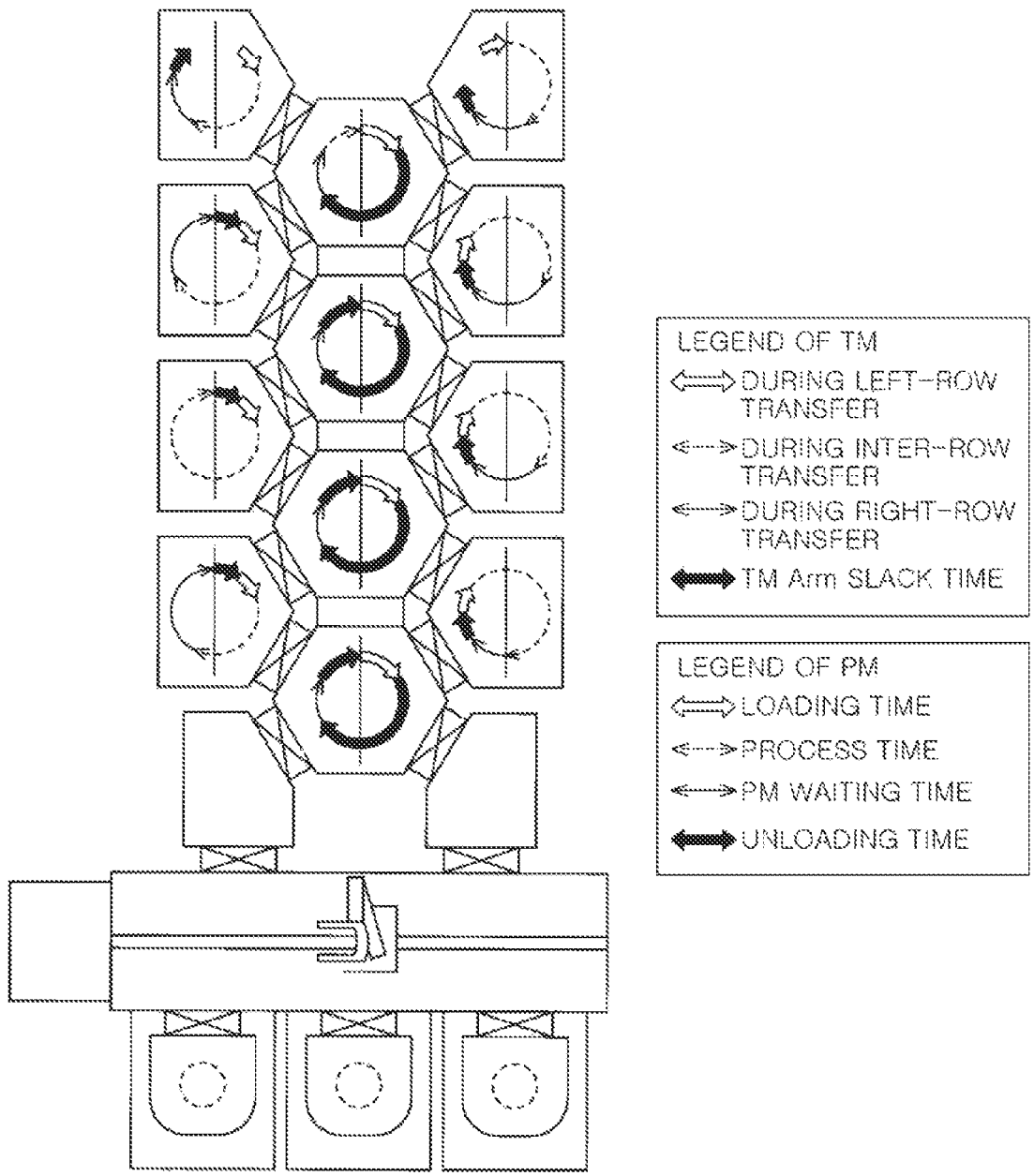
FIG. 16 is a diagram showing an example of operation contents of each process module and transfer module within a cycle time when there is no immediate unloading process module.
Figure 17:
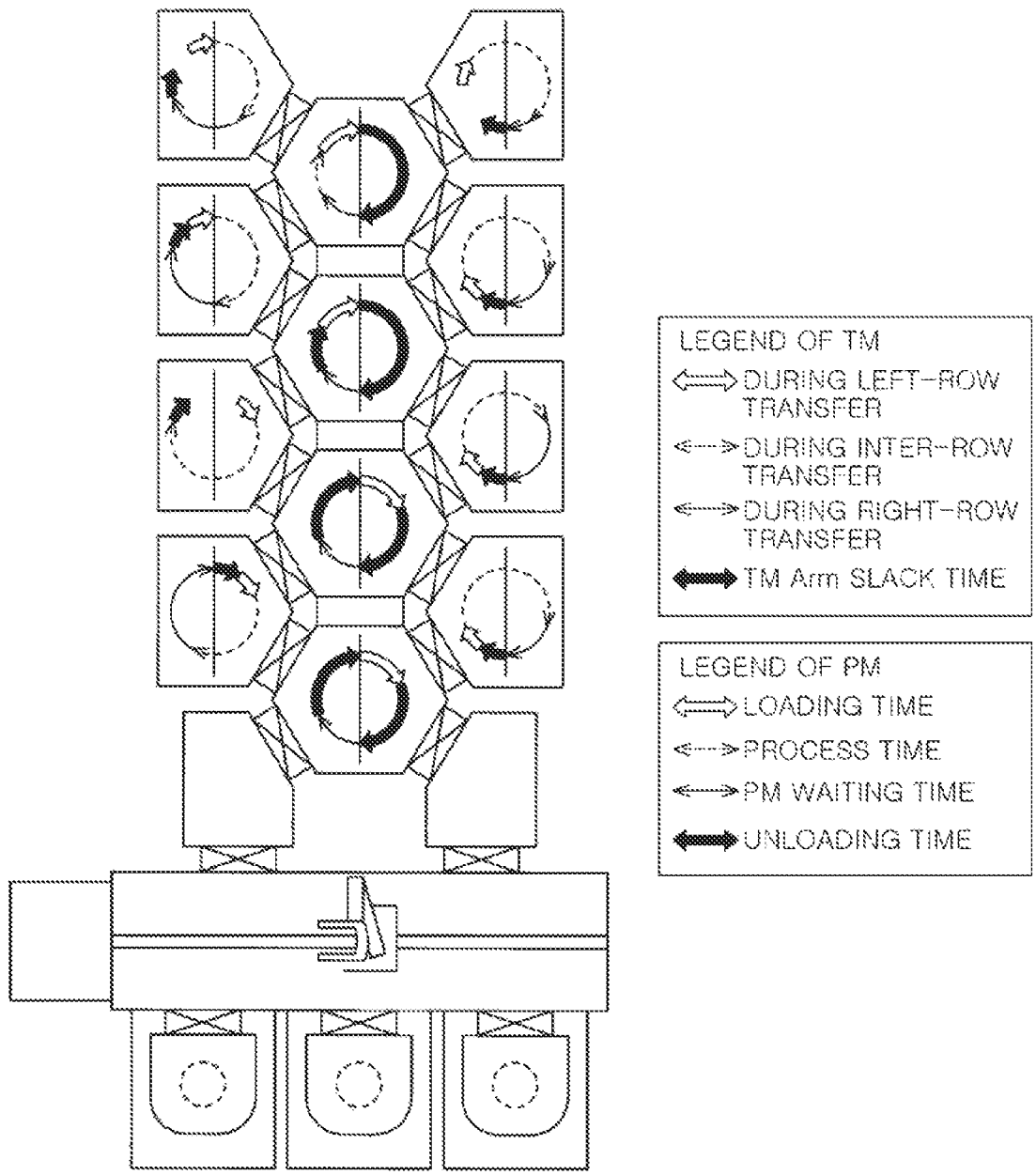
FIG. 17 is a diagram showing an example of operation contents of each process module and transfer module within a cycle time when there is an immediate unloading process module.

FIGS. 16 and 17 are diagrams showing an example of the operation contents of each process module and transfer module within the cycle time. FIG. 16 shows a case in which there is no immediate unloading process module. FIG. 17 shows a case in which there is an immediate unloading process module. In FIGS. 16 and 17, one round of circles shown in the process modules PM1 to PM8 and the transfer modules TM1 to TM4 indicates the cycle time, and the type of arrow indicates what the cycle time is used for.

As shown in FIG. 16, when there is no immediate unloading process module, right-row transfer, inter-row transfer, and left-row transfer are performed at the same timing in all of the transfer modules TM1 to TM4. In addition, a time from loading to unloading the wafer of the phase boundary process module PM7 is shorter than that of the normal process module as much as the maximum wafer transfer time of one time.

FIG. 17 shows an example in which the process module PM3 is an immediate unloading process module. As shown in FIG. 17, the process module PM3, which is the immediate unloading process module, transfers the wafer without following the cycle time of the normal process module. As shown in FIG. 17, when there is the immediate unloading process module, it may be seen that a transfer timing is shifted with the immediate unloading process module as the boundary even between the same rows. However, as shown in FIG. 17, it may be seen that there is no contention between the transfer modules TM1 to TM4 and there is no problem.

Figure 18:
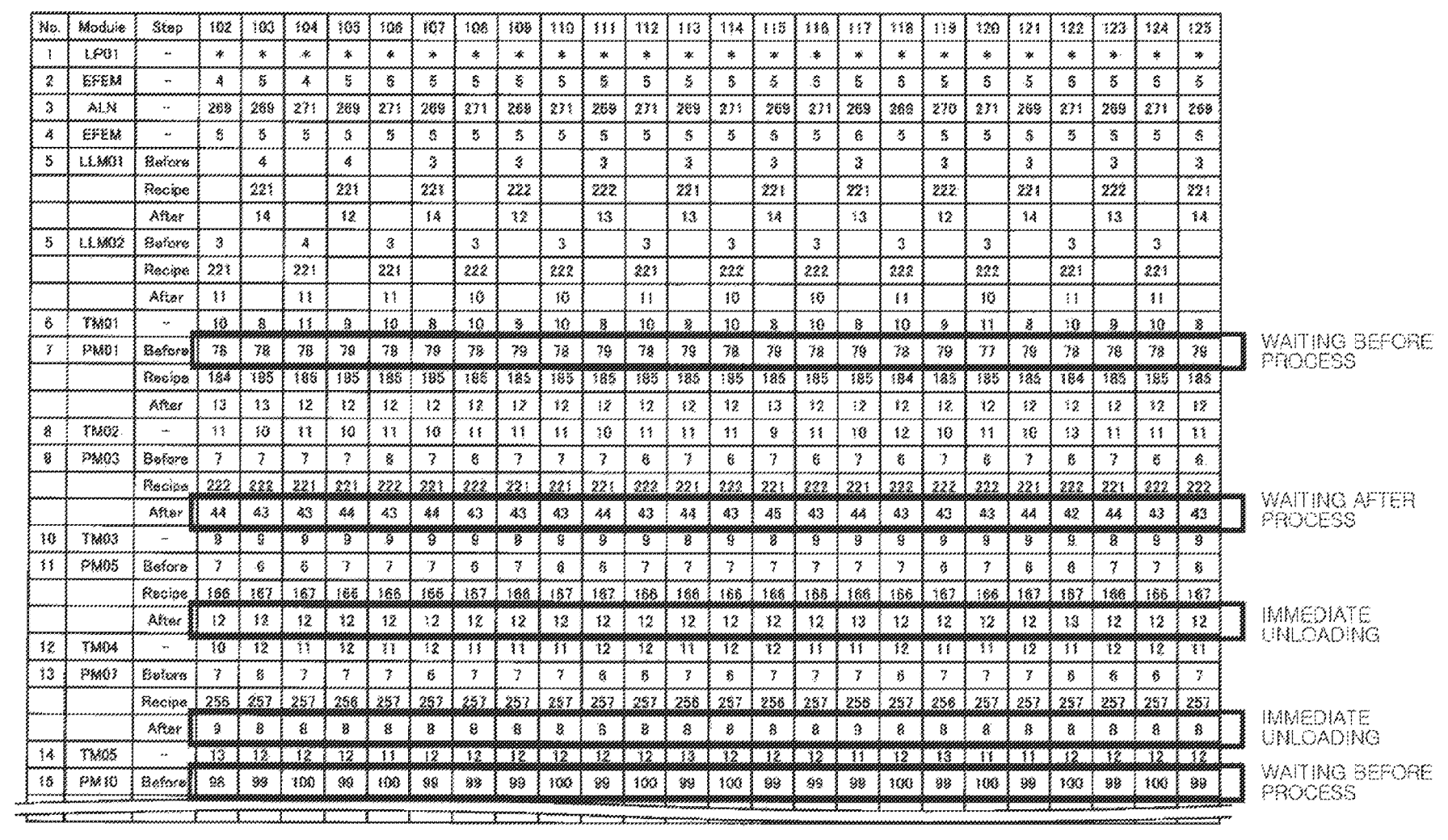

FIG. 18 is a configuration diagram of an example of the process completion performance time stored in the process completion performance time storage in the case of FIG. 9. In addition, as in FIG. 6, a vertical axis of FIG. 18 indicates various modules in which wafers are serially transferred in the order in which the wafers are serially transferred. In addition, as in FIG. 6, a horizontal axis of FIG. 18 indicates the wafers to which the desired process is performed in the order in which the desired process is performed.

As shown in FIG. 18, in the control of serial transfer according to a wafer transfer plan generated using the unloading interval designation function and the cycle time constant transfer function, waiting after the process, waiting before the process, and immediate unloading are set for each process module, and the wafers are serially transferred so as to satisfy the waiting after the process, the waiting before the process, and the immediate unloading. In FIG. 18, the wait as shown in FIGS. 6 and 8 does not occur, and it is possible to suppress variation in a residence time of the process module for each wafer.

According to the embodiment, when the plurality of wafers are serially transferred in the semiconductor manufacturing apparatus 1 to perform the desired process, it is possible to suppress the variation in process results for the plurality of wafers by suppressing the variation in the residence time of the wafers in the process module.

Although preferred embodiments of the present invention have been described in detail above, the present invention is not limited to the above-described embodiments, and various modifications and substitutions may be made to the above-described embodiments without departing from the scope of the present invention.

What is claimed is:

1. A semiconductor manufacturing apparatus including a plurality of process modules for performing desired processes on a plurality of substrates and a plurality of transfer modules for serially transferring the plurality of substrates to the plurality of process modules, the semiconductor manufacturing apparatus comprising:

a scheduler for calculating a cycle time, which is common to each of the plurality of process modules, so that a difference in time required for each of the desired processes of the plurality of process modules is within an allowable time range and generating a transfer plan for the plurality of substrates based on the cycle time; and a transfer controller for controlling the plurality of transfer modules so that the plurality of substrates are serially transferred to the process modules according to the generated transfer plan.

2. The semiconductor manufacturing apparatus of claim 1, wherein the scheduler allocates a waiting time for the time required for each of the desired processes so that the time required for each of the desired processes matches the cycle time.

3. The semiconductor manufacturing apparatus of claim 2, wherein the scheduler calculates the cycle time based on a maximum process time and a maximum transfer time of each of the desired processes.

4. The semiconductor manufacturing apparatus of claim 2, wherein the scheduler allocates the waiting time by any one of post-process waiting allocated after the desired process, pre-process waiting allocated before the desired process, and immediate unloading allocated within the serial transfer.

5. The semiconductor manufacturing apparatus of claim 1, wherein the scheduler divides the serial transfer of the substrates by the plurality of transfer modules into a plurality of phases and generates the transfer plan of the plurality of substrates to match a timing of the serial transfer of the substrates divided into the same phases.

6. The semiconductor manufacturing apparatus of claim 5, wherein the scheduler divides the serial transfer of the substrates by the plurality of transfer modules into transfer of a first row, transfer of a second row, and transfer between the first row and the second row, and generates the transfer plan for the plurality of substrates so that the serial transfer of the substrates is executed in the order of a first phase of performing the transfer of the first row, a second phase of performing the transfer between the first row and the second row, and a third phase of performing the transfer of the second row.

7. A substrate transfer method of a semiconductor manufacturing apparatus including a plurality of process modules for performing desired processes on a plurality of substrates and a plurality of transfer modules for serially transferring the plurality of substrates to the plurality of process modules, the substrate transfer method comprising:

calculating a cycle time, which is common to each of the plurality of process modules, so that a difference in time required for each of the desired processes of the plurality of process modules is within an allowable time range and generating a transfer plan for the plurality of substrates based on the cycle time; and controlling the plurality of transfer modules so that the plurality of substrates are serially transferred to the process modules according to the generated transfer plan.

8. A program causing a semiconductor manufacturing apparatus including a plurality of process modules for performing desired processes on a plurality of substrates and a plurality of transfer modules for serially transferring the plurality of substrates to the plurality of process modules to:

calculate a cycle time, which is common to each of the plurality of process modules, so that a difference in time required for each of the desired processes of the plurality of process modules is within an allowable time range and generate a transfer plan for the plurality of substrates based on the cycle time; and control the plurality of transfer modules so that the plurality of substrates are serially transferred to the process modules according to the generated transfer plan.

\* \* \* \* \*